US009973079B2

United States Patent
Mayes et al.

(10) Patent No.: US 9,973,079 B2
(45) Date of Patent: May 15, 2018

(54) SYNCHRONIZED CHARGE PUMP-DRIVEN INPUT BUFFER AND METHOD

(71) Applicant: Linear Technology Corporation, Milpitas, CA (US)

(72) Inventors: Michael Keith Mayes, Nevada City, CA (US); Todd Stuart Kaplan, Grass Valley, CA (US); David Edward Bliss, Loomis, CA (US)

(73) Assignee: Linear Technology Corporation, Milpitas, CA (US)

( * ) Notice: Subject to any disclaimer, the term of this patent is extended or adjusted under 35 U.S.C. 154(b) by 109 days.

(21) Appl. No.: 14/169,084

(22) Filed: Jan. 30, 2014

(65) Prior Publication Data

US 2014/0240035 A1  Aug. 28, 2014

Related U.S. Application Data

(60) Provisional application No. 61/769,684, filed on Feb. 26, 2013.

(51) Int. Cl.
*G05F 3/02* (2006.01)
*G05F 1/10* (2006.01)
(Continued)

(52) U.S. Cl.
CPC .............. *H02M 1/44* (2013.01); *H02M 3/07* (2013.01); *H03M 1/0818* (2013.01);
(Continued)

(58) Field of Classification Search
CPC .. H02M 3/073; H02M 3/07; H02M 2003/077; G11C 5/145; G05F 3/205
(Continued)

(56) References Cited

U.S. PATENT DOCUMENTS 6,002,355 A    12/1999  Del Signore et al.
6,366,230 B1*  4/2002   Zhang et al. ................ 341/162
(Continued)

FOREIGN PATENT DOCUMENTS

EP   2922207 A1   9/2015
JP   2006121549 A 5/2006

OTHER PUBLICATIONS

Extended European Search Report for Application No. 14001075. 2-1805, dated Sep. 12, 2014, 8 pages.
(Continued)

*Primary Examiner* — Quan Tra
(74) *Attorney, Agent, or Firm* — Schwegman, Lundberg & Woessner, P.A.

(57) ABSTRACT

An integrated circuit includes (a) an analog-to-digital converter operated according to a first clock signal; and (b) a charge pump circuit providing a negative power supply voltage to the integrated circuit, the charge pump circuit being operated according to a second clock signal having a frequency that is different from a frequency of the first clock signal, such that a noise level introduced by the charge pump into the analog-to-digital converter is less than the average noise level over a predetermined range of frequencies for the second clock signal. The integrated circuit may further include a clock divider circuit (e.g., a programmable clock divider) that generates both the first clock signal and the second clock signal.

21 Claims, 3 Drawing Sheets

(51) Int. Cl.
*H02M 1/44* (2007.01)
*H02M 3/07* (2006.01)
*H03M 1/08* (2006.01)
*H03M 1/12* (2006.01)
*H03M 3/00* (2006.01)

(52) U.S. Cl.
CPC ......... *H03M 1/1245* (2013.01); *H03M 3/368* (2013.01); *H03M 3/496* (2013.01)

(58) Field of Classification Search
USPC .................................. 327/536; 341/126–172
See application file for complete search history.

(56) References Cited

U.S. PATENT DOCUMENTS

| | | | |
|---|---|---|---|
| 7,348,829 B2 * | 3/2008 | Choy et al. | 327/536 |
| 7,515,076 B1 | 4/2009 | Singh et al. | |
| 7,911,369 B2 * | 3/2011 | Morie et al. | 341/161 |
| 2003/0229815 A1 * | 12/2003 | Fujiwara et al. | 713/500 |
| 2012/0188107 A1 | 7/2012 | Ashburn, Jr. et al. | |
| 2012/0326771 A1 * | 12/2012 | MacFarlane | 327/536 |

OTHER PUBLICATIONS

Maxim, Stand-Alone, 4.5-/3.5-Digit Panel Meters with 4-20mA Output, Rev 1; Jan. 2006, Maxim Integrated Products, pp. 1-25.
"European Application Serial No. 14001075.2, Communication Pursuant to Article 94(3) EPC dated Dec. 21, 2017", 6 pgs.
"Stand-Alone, 4.543.5-Digit Panel Meters with 4-20mA Output", Maxim, 19-3889; Rev 1; Jan. 2006, <URL:http://datasheets.maximintegrated.com/en/ds/MAX1365-MAXI 367.pdf>, (Jan. 31, 2006), 1-25.
"ESPACENET Machine Translation of JP 2006-121549A, published May 11, 2006", 1-18.
"European Application Serial No. 14001075.2, Response filed Feb. 20, 2018 to Communication Pursuant to Article 94(3) EPC dated Dec. 21, 2017", 46 pgs.
"European Application Serial No. 14001075.2, Response filed Mar. 23, 2016 to Extended European Search Report dated Sep. 12, 2014", 162 pgs.

* cited by examiner

US 9,973,079 B2

SYNCHRONIZED CHARGE PUMP-DRIVEN INPUT BUFFER AND METHOD

CROSS REFERENCE TO RELATED APPLICATIONS

The present application is related to and claims priority of U.S. provisional patent application ("Provisional Application"), Ser. No. 61/769,684, entitled "SYNCHRONIZED CHARGE PUMP-DRIVEN INPUT BUFFER AND METHOD", filed on Feb. 26, 2013. The Provisional Application is hereby incorporated by reference in its entirety.

BACKGROUND OF THE INVENTION

1. Field of the Invention

The present invention relates to power supply circuits in an integrated circuit. In particular, the present invention relates to providing an on-chip negative power supply circuit that derives a negative voltage based on an externally provided positive supply voltage.

2. Discussion of the Related Art

Many applications that use an analog-to-digital (A/D) converter require digitizing signals having voltages that are at ground or below ground. In the prior art, an extra negative bias voltage is required to drive the negative rail of an input buffer to the A/D converter. Providing the additional negative bias voltage adds to the total system cost and complexity. In an integrated circuit, the ability for an on-chip A/D converter to digitize a signal that is at ground or slightly below ground without requiring an externally provided negative power supply voltage is particularly valuable.

SUMMARY

According to one embodiment of the present invention, an integrated circuit includes (a) an analog-to-digital converter (ADC) operated according to a first periodic or "clock" signal; and (b) a charge pump circuit providing a negative power supply voltage to the integrated circuit, the charge pump circuit being operated according to a second clock signal having a frequency that is different from a frequency of the first clock signal, such that a noise level introduced by the charge pump into the ADC is reduced a frequency range of interest. The integrated circuit may further include a clock divider circuit (e.g., a programmable clock divider) that generates both the first clock signal and the second clock signal.

According to one embodiment of the present invention, the integrated circuit may include an oscillator circuit providing an oscillator frequency that can be used to create clock signals for both the ADC and the charge pump. In one implementation, the oscillator frequency is an integer multiple of both the clock signal for the ADC and the clock signal for the charge pump. One or more clock divider circuits can be used to generate both the clock signal for the charge pump and the clock signal for the ADC. In one implementation, the ratio of the oscillator frequency to the frequency of the first clock signal and the ratio of the oscillator frequency to the frequency of the second clock signal are relatively prime (e.g., the first clock signal is divided down from the oscillator frequency by a factor of 20, and the second clock signal is divided down from the oscillator frequency by a factor of 19). In another implementation, the ratio of the oscillator frequency to the frequency of the second clock signal is a multiple of 4 that is not divisible by 5. In yet another implementation, the ratio of the oscillator frequency to the frequency of the second clock signal is a prime number.

In another implementation, the charge pump frequency is chosen so that the ADC conversion time, or other times (e.g., the time delay in one side of a symmetric digital filter) is an integer multiple of a cycle of the charge pump clock signal, so as to cancel, at least n part, timing errors introduced by the charge pump.

The present invention is better understood upon consideration of the detailed description below in conjunction with the accompanying drawings.

DETAILED DESCRIPTION OF THE PREFERRED EMBODIMENTS

For convenience, the present invention is described in the context of an integrated circuit that is suitable for measuring the voltage of a thermocouple. However, the present invention is not limited to applications requiring thermocouple measurements. The present invention may be used in any suitable application that requires a circuit to process an input signal that is outside a nominal voltage range of the circuit.

Figure 1:
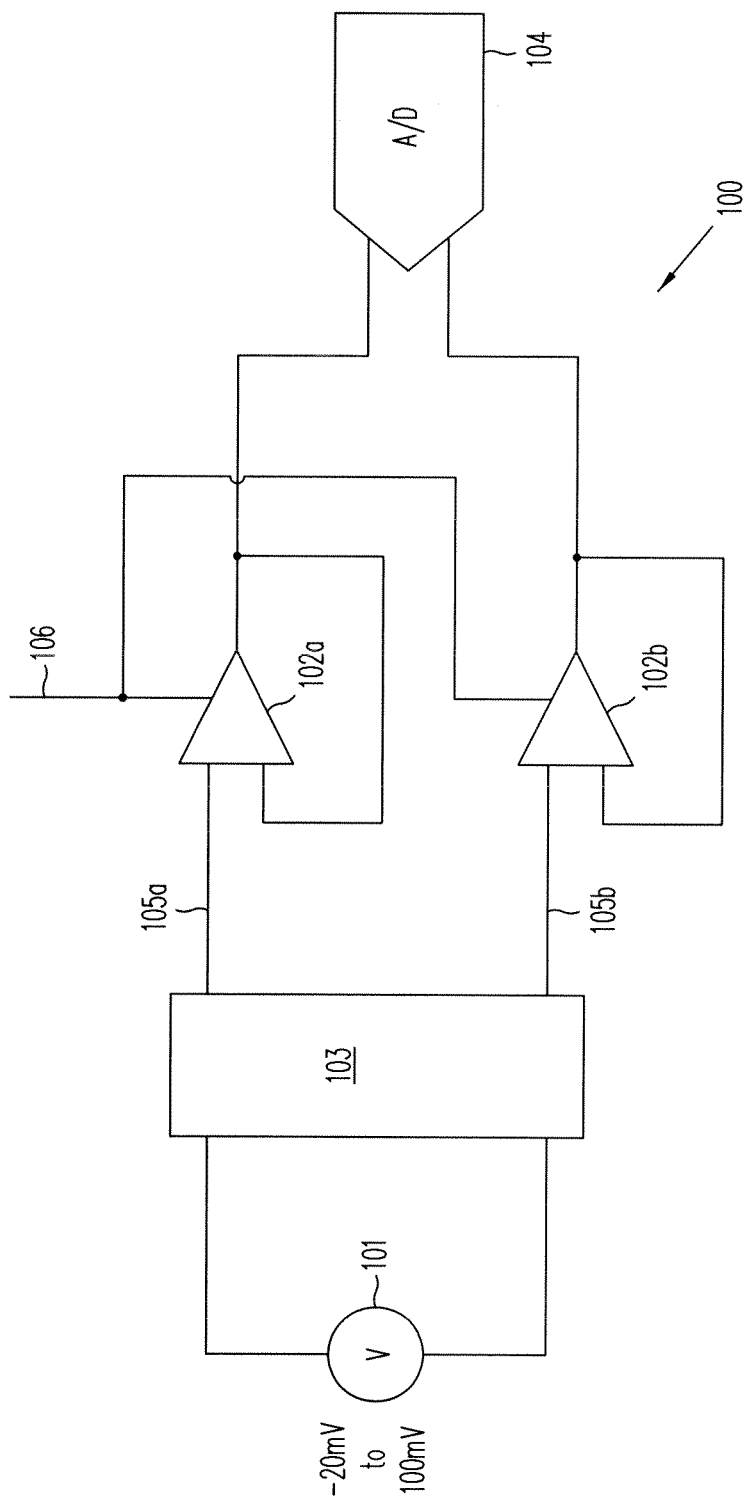
FIG. 1 shows schematically circuit 100 that allows digitizing of a negative signal without an external negative power supply.

FIG. 1 shows schematically circuit 100 that allows digitizing of a negative signal without an external negative power supply. As shown in FIG. 1, circuit 100 receives an external signal 101, represented by a voltage source that varies between −20 millivolts (mV) and 100 mV. The input voltage is typically filtered by reverser circuit 103, which may be implemented by a conventional circuit that eliminates any offset voltage in input buffers or amplifiers 102a and 102b and A/D converter 104 to follow. The output signal of reverser circuit 103, which is provided across terminals 105a and 105b, is buffered by unity-gain amplifiers 102a and 102b. The output signals of the input buffers 102a and 102b are then provided to A/D converter 104 for digitizing. To allow digitizing a slightly negative signal, input buffers 102a and 102b has a negative power supply driven by a periodic signal that varies between −200 mV and −180 mV. The periodic signal may be generated by a charge pump. However, such a charge pump is typically operated using a clock-fed switched capacitor network, so that the −200 mV signal generated by the charge pump has several millivolts of clock feed-through noise. Without careful selection of the clock signal's frequency, this significant clock feed-through is introduced to the input signal path. Such interference renders driving the input buffers 102a and 102b directly with the charge pump-generated clock signal untenable.

Figure 2:
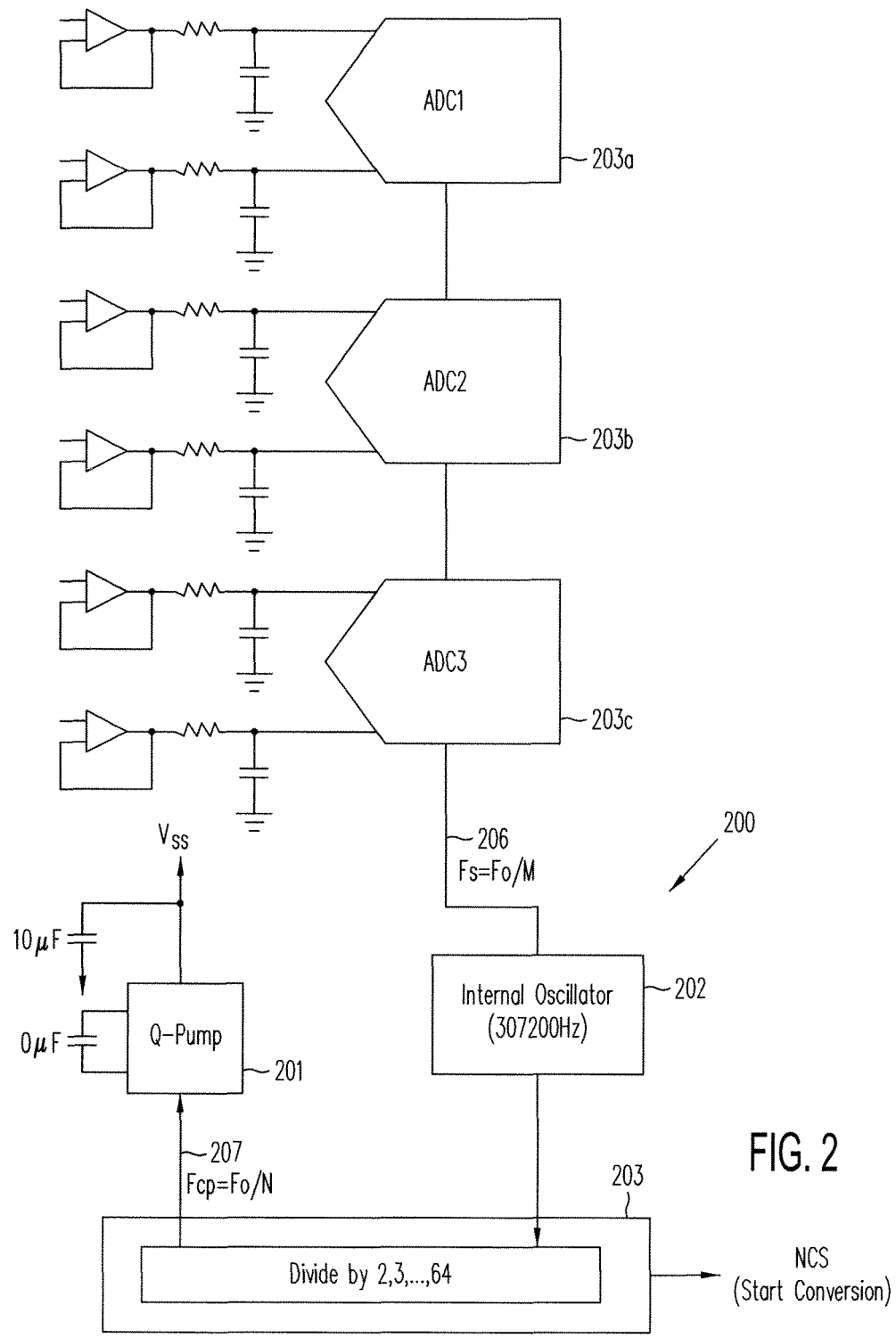
FIG. 2 shows schematically charge pump circuit 200 of an integrated circuit, in accordance with one embodiment of the present invention.

Therefore, according to one embodiment of the present invention, the frequency of the charge pump clock signal is selected such that the noise generated by the operation of the charge pump essentially fall within the rejection band of the A/D converter's digital filter. This approach is illustrated, for example, in the schematic circuit of FIG. 2. FIG. 2 shows schematically charge pump circuit 200 of an integrated circuit, in accordance with one embodiment of the present invention. As shown in FIG. 2, clock signal 206 is generated from internal oscillator 202 to operate delta-sigma A/D converter 203, represented by A/D converter circuits 203a, 203b and 203c. In one embodiment, clock signal 206 is divided down by a factor M (e.g., M equals 20) in divider circuit 203 from internal oscillator 202's frequency of $F_0$ (e.g., 307.2 KHz). At the same time, charge pump circuit 201 is fed by clock signal 207, which is divided down in divider 203 from frequency $F_0$ by a factor N. Clock signal 207 may be used to control the input buffers (e.g., input buffers 102a and 102b of FIG. 1) to delta-sigma A/D converter 203. Charge pump circuit 201 may be implemented, for example, by a conventional charge pump circuit. Divider circuit 203 may enjoy a simpler design if the values of M and N are integers.

Figure 3:
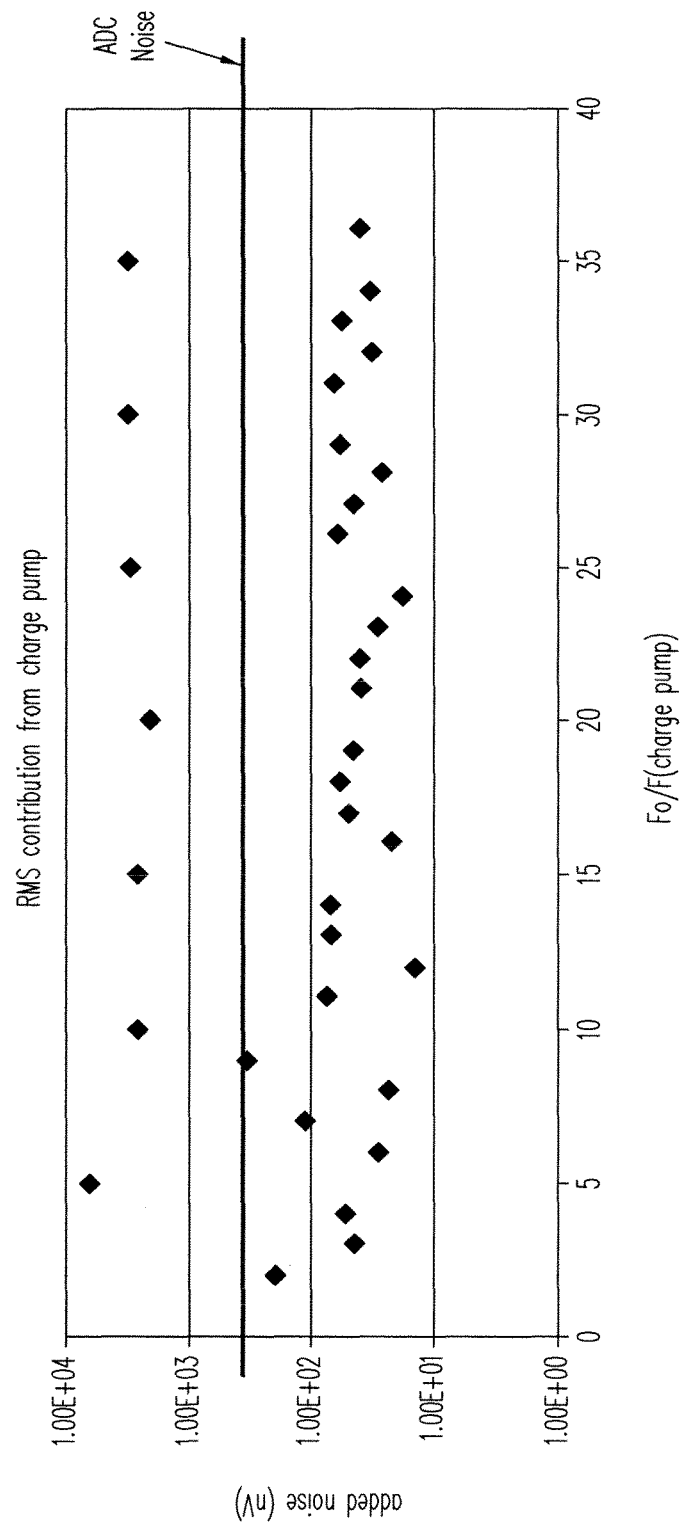
FIG. 3 shows measurements of RMS noise contribution by the charge pump as a function of the divisor N, in a prototype circuit constructed in accordance with one embodiment of the present invention.

The value of N may be selected from a characterization of delta-sigma A/D converter 203's noise characteristics as a function of clock signal 207. FIG. 3 shows measurements of RMS noise contribution by the charge pump as a function of the divisor N, in a prototype circuit constructed in accordance with one embodiment of the present invention. The prototype implements schematic circuit 200 of FIG. 2, with divider 203 being implemented by a suitable clock divider (e.g., a conventional programmable clock divider that allows dividing down by an integral factor between 2 and 63). The results of FIG. 3 show that any prime number greater than 10 would introduce less than average noise (i.e., below the average ADC noise line in FIG. 3). In addition, many multiples of 4 that are not divisible by 5 (e.g., 8, 12, 16, 24, 28, 32) also provide lower than average noise. Accordingly, one suitable value for N is 19. It would also be particularly beneficial if harmonics of the selected clock signal frequency is also within the rejection band of the delta-sigma A/D converter.

By forcing the charge pump sampling frequency into the rejection nulls of sigma-delta A/D converter 203's digital filter, clock feed-through interference is attenuated. As a result, buffer amplifiers (e.g., input buffers 102a and 102b of FIG. 1) may be operated with charge pump signal 207 to allow signals at ground or below ground to be digitized by delta-sigma A/D converter 203 without requiring an external negative power supply voltage. Furthermore, by measuring the total error over the entire input range at various temperatures when operating under the selected charge pump frequency and comparing it the total error when the charge pump circuit is not used (i.e., by providing an external negative power supply voltage), the selected charge pump frequency can be varied to attenuate the error introduced by charge pump clock signal 207.

The detailed description above is provided to illustrate specific embodiments of the present invention and is not intended to be limiting. Numerous modifications and variations within the scope of the present invention are possible. The present invention is set forth in the accompanying claims.

We claim:

1. An electronic circuit, comprising:
an analog-to-digital converter operated according to a first clock signal, the first clock signal having a first frequency, the analog-to-digital converter having a frequency rejection band and producing a digital output signal based on an analog input signal; and
a charge pump circuit providing a negative power supply voltage to the analog-to-digital converter, the charge pump circuit being operated according to a second clock signal having a second frequency that is different from the first frequency of the first clock signal, wherein the second frequency, for operating the charge pump circuit, is selected to be within the frequency rejection band of the analog-to-digital converter, such that a noise effect on the digital output signal of noise introduced by the charge pump is attenuated by the frequency rejection of the analog-to-digital converter.

2. The electronic circuit of claim 1, further comprising a frequency divider circuit that receives a master clock signal and that, based on the master clock signal, generates both the first clock signal and the second clock signal.

3. The electronic circuit of claim 2, further comprising an oscillator circuit that generates the master clock signal at a frequency that can be divided down to generate the second frequency such that the second frequency is within the frequency rejection band of the analog-to-digital converter.

4. The electronic circuit of claim 2, wherein the frequency divider circuit comprises a programmable clock divider that is programmable to generate the second frequency selected to be within the frequency rejection band of the analog-to-digital converter.

5. The electronic circuit of claim 1, wherein a harmonic of the frequency of the second clock signal is within a rejection band of the analog-to-digital converter.

6. A method for providing a reduced noise power supply circuit for an analog-to-digital converter, comprising:
providing a first clock signal of a first frequency to operate the analog-to-digital converter to produce a digital output signal based on an analog input signal; and
providing a second clock signal of a second frequency different from the first frequency to operate a charge pump circuit that generates the negative power supply voltage provided to the analog-to-digital converter, wherein the second frequency is selected to be within a frequency rejection band of the analog-to-digital converter such that a noise effect on the digital output signal introduced by the charge pump is attenuated by the frequency rejection band of the analog-to-digital converter.

7. The method of claim 6, wherein the first clock signal and the second clock signal are generated by dividing from a master clock signal.

8. The method of claim 7, wherein the first frequency equals dividing a master frequency of the master clock signal by a first integer and wherein the second frequency equals dividing the master clock frequency by a second integer that is a prime number selected such that the second frequency is within the frequency rejection band of the analog-to-digital converter.

9. The method of claim 7, wherein the frequency divider circuit comprises a programmable clock divider programmed such that the second frequency is within the frequency rejection band of the analog-to-digital converter.

10. The method of claim 6, wherein a harmonic the second frequency is within a rejection band of the analog-to-digital converter.

11. The electronic circuit of claim 1, wherein the analog-to-digital converter includes a delta-sigma analog-to-digital converter providing a digital filter establishing the rejection frequency band in which the second frequency, for operating the charge pump circuit, is located.

12. The electronic circuit of claim 11, wherein the second frequency is selected such that one or more harmonics of the second frequency are located in one or more rejection frequency nulls of the digital filter provided by the sigma-delta analog-to-digital converter.

13. The electronic circuit of claim 1, comprising a buffer amplifier arranged to buffer an analog input signal for providing a buffered analog input signal to the analog-to-digital converter, wherein the buffer amplifier and the analog-to-digital converter are both coupled to the charge pump circuit to receive a negative supply voltage from the charge pump circuit for operating the buffer amplifier and the analog-to-digital converter in a normal mode of operation without requiring an external negative power supply voltage.

14. The electronic circuit of claim 13, further comprising:
an external negative power supply input, for being coupled to the analog-to-digital converter circuit for use selecting the second frequency to be within the frequency rejection band of the analog-to-digital converter by comparing an error of the analog-to-digital converter digital signal output when a negative supply of the analog-to-digital converter circuit is supplied by the external negative power supply input to an error of the analog-to-digital converter digital signal output when the negative supply of the analog-to-digital converter circuit is supplied by the charge pump circuit.

15. The method of claim 6, comprising selecting the second frequency, for operating the charge pump circuit, to be within a frequency rejection band of a delta-sigma analog-to-digital converter providing a digital filter establishing the rejection frequency band.

16. The method of claim 15, comprising selecting the second frequency such that one or more harmonics of the second frequency are located in one or more rejection frequency nulls of the digital filter provided by the sigma-delta analog-to-digital converter.

17. The method of claim 6, comprising buffering an analog input signal to the analog-to-digital converter, the buffering performed using a negative supply voltage from the charge pump circuit without requiring an external negative power supply voltage.

18. The method of claim 17, further comprising:
selecting the second frequency to be within the frequency rejection band of the analog-to-digital converter circuit based on a total error in the digital output signal of the digital to analog-converter circuit.

19. The method of claim 18, comprising selecting the second frequency to be within the frequency rejection band of the analog-to-digital converter circuit based on a comparing of total error in the digital output signal of the digital to analog-converter circuit with the charge pump circuit providing the negative supply voltage of the analog-to-digital converter circuit to a total error in the digital output signal of the digital to analog-converter circuit without the charge pump circuit providing the negative supply voltage of the analog-to-digital converter circuit.

20. An electronic circuit, comprising:
an analog-to-digital converter operated according to a first clock signal, the first clock signal having a first frequency, the analog-to-digital converter having a frequency rejection band and producing a digital output signal based on an analog input signal; and
a switched-mode power supply circuit providing a negative power supply voltage to the analog-to-digital converter, the switched-mode power supply circuit being operated using a switching according to a second clock signal having a second frequency that is selected to be within the frequency rejection band of the analog-to-digital converter to attenuate an effect of switching noise on the digital output signal.

21. The electronic circuit of claim 20, wherein the analog-to-digital converter includes a delta-sigma analog-to-digital converter providing a digital filter providing frequency rejection bands, wherein one or more harmonics of the second frequency of the second clock signal are selected to be within one or more of the frequency rejection bands.

* * * * *